United States Patent [19]

Lee et al.

[11] Patent Number: 5,780,740

[45] Date of Patent: Jul. 14, 1998

[54] VIBRATORY STRUCTURE, METHOD FOR CONTROLLING NATURAL FREQUENCY THEREOF, AND ACTUATOR, SENSOR, ACCELERATOR, GYROSCOPE AND GYROSCOPE NATURAL FREQUENCY CONTROLLING METHOD USING VIBRATORY STRUCTURE

[75] Inventors: Ki Bang Lee, Seoul; Byung-leul Lee, Yongin; Young-ho Cho, Daejeon; Ci-moo Song, Sungnam, all of Rep. of Korea

[73] Assignees: Samsung Electronics Co., Ltd., Kyungki-do; Korea Advanced Institute of Science and Technology, Taejon, both of Rep. of Korea

[21] Appl. No.: 735,695

[22] Filed: Oct. 23, 1996

[30] Foreign Application Priority Data

Oct. 27, 1995 [KR] Rep. of Korea .................. 95-37626

[51] Int. Cl.$^6$ ............................................. G01P 9/00
[52] U.S. Cl. .......................... 73/504.12; 73/504.16; 73/504.02; 331/156
[58] Field of Search ..................... 73/504.02, 504.12, 73/504.04, 504.05, 504.16, 504.15; 33/156; 310/25

[56] References Cited

U.S. PATENT DOCUMENTS

| | | | |
|---|---|---|---|
| 4,926,143 | 5/1990 | Harada et al. | 331/156 |
| 5,361,635 | 11/1994 | Woodruff | 73/514.18 |
| 5,563,343 | 10/1996 | Shaw et al. | 73/514.18 |
| 5,600,064 | 2/1997 | Ward | 73/504.04 |
| 5,625,145 | 4/1997 | Maeno et al. | 73/504.12 |

*Primary Examiner*—Hezron E. Williams
*Assistant Examiner*—Richard A. Moller
*Attorney, Agent, or Firm*—Burns, Doane, Swecker & Mathis, L.L.P.

[57] ABSTRACT

A vibratory structure and a method for controlling the natural frequency thereof are provided. The device has at least one elastic member supported by a first support end, an inertial object which vibrates by the elastic force of the elastic member, a moving electrode coupled to the inertial object, at least one effective stiffness controlling electrode supported by a second support end, and a power supplier for applying a voltage to generate an electric force between the moving electrode and the effective stiffness controlling electrode. This vibratory structure can contribute to controlling and improving the performance of a sensor, an actuator or a gyroscope, which employs the vibratory structure.

14 Claims, 9 Drawing Sheets

VIBRATORY STRUCTURE, METHOD FOR CONTROLLING NATURAL FREQUENCY THEREOF, AND ACTUATOR, SENSOR, ACCELERATOR, GYROSCOPE AND GYROSCOPE NATURAL FREQUENCY CONTROLLING METHOD USING VIBRATORY STRUCTURE

BACKGROUND OF THE INVENTION

The present invention relates to a vibratory structure, a method for controlling the natural frequency thereof, and an actuator, a sensor, an accelerator, a gyroscope and a gyroscope natural frequency controlling method using a vibratory structure.

A vibratory structure has been recently used for various purposes, for example, in a gyroscope, a sensor like an accelerometer, or an actuator. The gyroscope has long been used as a core part of a navigation apparatus for missiles, sea-going vessels or aircraft. A gyroscope for military or aeronautical purposes, which is fabricated with a multitude of parts through precision processing and assembly, exhibits a precision performance. However, costly manufacturing process and cumbersome size make it inappropriate for industrial or home-use electronic appliances. A gyroscope for private demands can be used in a navigation apparatus for an automobile to detect its acceleration and angular velocity, or in a camcorder of a high magnification to detect and correct hand quivering. A sensor employing a vibratory structure is used in medical equipment or industrial measuring instruments.

FIG. 1A illustrates a conventional simplified vibratory structure. A vibratory structure 10 is composed of a spring 12 supported by a support end 13 and an inertial object 11. In the case of a vibratory structure having a multiple degree of freedom, an equivalent vibration system can be constituted of several connected vibratory structures shown in FIG. 1A. This vibratory structure 10 has a constant natural frequency with respect to an amplitude, as shown in FIG. 1B, since the mass m of the inertial object 11 and the spring constant k of the spring 12.

Therefore, once a sensor or an actuator employing the above vibratory structure is manufactured, it is difficult to freely alter the natural frequency of a vibration system. Further, though a metal such as silver can be deposited for fabrication of a vibratory structure to control the natural frequency, as disclosed in U.S. Pat. No. 4,107,349, the deposition itself is difficult and an additional process for controlling the natural frequency is required after the fabrication of the vibratory structure.

SUMMARY OF THE INVENTION

To overcome the above problems, it is a first object of the present invention to provide a vibratory structure having an effective stiffness controlling electrode for controlling the effective stiffness of the vibratory structure.

It is a second object of the present invention to provide a method for controlling the natural frequency of a vibratory structure by using the effective stiffness controlling electrode.

It is a third object of the present invention to provide an actuator having an effective stiffness controlling electrode for controlling the effective stiffness thereof.

It is a fourth object of the present invention to provide a sensor having an effective stiffness controlling electrode for controlling the effective stiffness thereof.

It is a fifth object of the present invention to provide an accelerator having an effective stiffness controlling electrode for controlling the effective stiffness of a vibratory structure.

It is a sixth object of the present invention to provide a gyroscope having an effective stiffness controlling electrode for controlling the effective stiffness of a vibratory structure.

It is a seventh object to provide a method for controlling the natural frequency of a gyroscope by using an effective stiffness controlling electrode.

To achieve the first object, there is provided a vibratory structure comprising: at least one elastic member supported by a first support end; an inertial object which vibrates by the elastic force of the elastic member; a moving electrode coupled to the inertial object; at least one effective stiffness controlling electrode supported by a second support end; and a power supplier for applying a voltage to generate an electric force between the moving electrode and the effective stiffness controlling electrode.

It is preferred that the inertial object and the moving electrode are integrally formed.

It is preferred that the inertial object vibrates in one axis direction, and the effective stiffness controlling electrode is disposed to face the inertial object along the axis direction.

It is preferred that the inertial object vibrates in one axis direction, and two effective stiffness controlling electrodes are disposed under and over the inertial object.

It is preferred that the moving electrode has at least one finger, and the effective stiffness controlling electrode has at least one finger which can be inserted between fingers of the moving electrode with a predetermined distance.

It is preferred that the elastic member is a rotational spring having a rotational stiffness, and the inertial object rotates.

It is preferred that an electric force between the effective stiffness controlling electrode and the moving electrode is equal to the elastic force of the elastic member according to the change of the voltage supplied from the power supplier.

To achieve the second object, there is provided a method for controlling the natural frequency of a vibratory structure, the vibratory structure comprising: at least one elastic member supported by a first support end; an inertial object which vibrates by the elastic force of the elastic member; a moving electrode coupled to the inertial object; at least one effective stiffness controlling electrode supported by a second support end; and a power supplier for applying a voltage to generate an electric force between the moving electrode and the effective stiffness controlling electrode, wherein the effective stiffness and natural frequency of the vibratory structure are controlled by adjusting the voltage.

It is preferred that the inertial object and the moving electrode are integrally formed.

To achieve the third object, there is provided an actuator including at least one vibratory structure, the vibratory structure comprising: at least one elastic member supported by a first support end; an inertial object which vibrates by the elastic force of the elastic member; a moving electrode coupled to the inertial object; at least one effective stiffness controlling electrode supported by a second support end; and a power supplier for applying a voltage to generate an electric force between the moving electrode and the effective stiffness controlling electrode, wherein the effective stiffness and natural frequency of the vibratory structure are controlled by adjusting the voltage.

It is preferred that the inertial object and the moving electrode are integrally formed.

To achieve the fourth object, there is provided a sensor including at least one vibratory structure, the vibratory structure comprising: at least one elastic member supported by a first support end; an inertial object which vibrates by the elastic force of the elastic member; a moving electrode coupled to the inertial object; at least one effective stiffness controlling electrode supported by a second support end; and a power supplier for applying a voltage to generate an electric force between the moving electrode and the effective stiffness controlling electrode. wherein the effective stiffness and natural frequency of the vibratory structure are controlled by adjusting the voltage.

It is preferred that the inertial object and the moving electrode are integrally formed.

To achieve the fifth object, there is provided an accelerator comprising: at least one elastic member supported by a first support end; an inertial object which vibrates by the elastic force of the elastic member; a moving electrode coupled to the inertial object; a detector for detecting the vibration of the inertial object; at least one effective stiffness controlling electrode supported by a second support end; and a power supplier for applying a voltage to generate an electric force between the effective stiffness controlling electrode and the moving electrode.

It is preferred that the inertial object and the moving electrode are integrally formed.

To achieve the fifth object, there is also provided a resonant accelerator comprising: at least one elastic member supported by a first support end; an inertial object which vibrates the elastic force of the elastic member; a moving electrode coupled to the inertial object; a detector for detecting the vibration of the inertial object; an exciter for resonating the inertial object; at least one effective stiffness controlling electrode supported by a second support end; and a power supplier for applying a voltage to generate an electric force between the effective stiffness controlling electrode and the moving electrode.

It is preferred that the inertial object and the moving electrode are integrally formed.

To achieve the sixth object, there is provided a gyroscope comprising: a substrate having a plane of a first axis and a second axis; a support end supported by the substrate; an elastic unit supported by the support and extended in the first- and second-axis directions; an inertial unit for vibrating in the first axis direction and a third axis direction; a finger electrode formed integrally into the inertial unit; a driving unit having a finger to be engaged with the finger electrode of the inertial unit, for applying an electric force to the inertial object in the first axis direction; a detector for detecting vibrations of the inertial object in the first- and third-axis directions; an effective stiffness controlling electrode disposed to face the inertial unit on the substrate to control the third-axis directional natural frequency of the inertial unit; and a power supplier for applying a voltage to the effective stiffness controlling electrode and the finger electrode of the inertial unit.

It is preferred that the effective stiffness controlling electrode is replaced with the detector for detecting a third-axis directional vibration.

To achieve the seventh object, there is provided a method for controlling the natural frequency of a gyroscope comprising: a substrate having a plane of a first axis and a second axis; a support end supported by the substrate; an elastic unit supported by the support and extended in the first- and second-axis directions; an inertial unit for vibrating in the first axis direction and a third axis direction; a finger electrode formed integrally into the inertial unit; a driving unit having a finger to be engaged with the finger electrode of the inertial unit, for applying an electric force to the inertial object in the first axis direction; a detector for detecting vibrations of the inertial object in the first- and third-axis directions; an effective stiffness controlling electrode disposed to face the inertial unit on the substrate to control the third-axis directional natural frequency of the inertial unit; and a power supplier for applying a voltage to the effective stiffness controlling electrode and the finger electrode of the inertial unit, wherein the third-axis directional natural frequency of the inertial unit is controlled by controlling the voltage applied to the effective stiffness controlling electrode and the finger electrode of the inertial unit.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 2A:
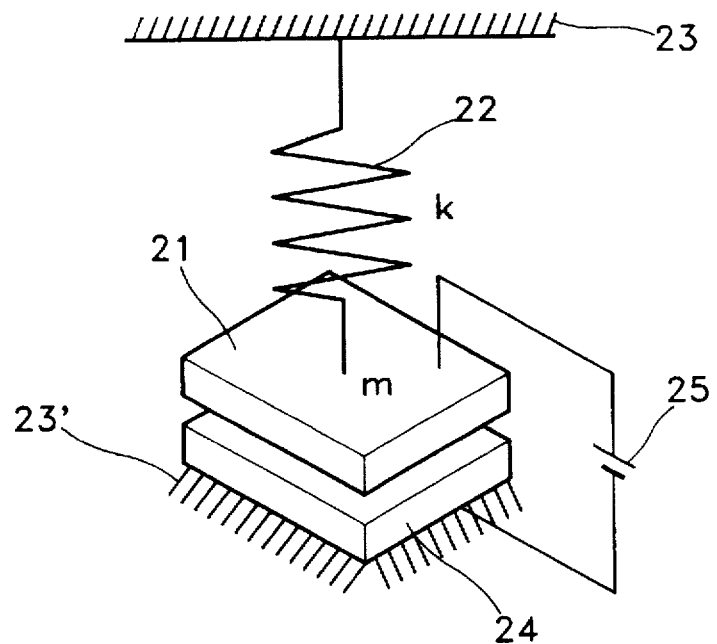
FIG. 2A is a schematic view of a vibratory structure according to a first embodiment of the present invention.

FIG. 2A illustrates a vibratory structure employing an effective stiffness controlling electrode according to the present invention. The vibratory structure has a spring 22 (elastic member) supported by a first support end 23, an upper electrode and an inertial object 21 which are integrally formed, for moving up and down by the elastic force of the spring 22, a lower electrode or an effective stiffness controlling electrode 24 supported by a second support end 23', facing the inertial object 21, and a power supplier 25 for applying a voltage between the inertial object 21 and the effective stiffness controlling electrode 24. Reference character m denotes the mass of the inertial object, and reference numeral k denotes the stiffness or spring constant of the spring 22.

In the vibratory structure as constituted above, an elastic force of the spring 22 depending on the displacement of the inertial object 21 and an electric force generated by applying a voltage are applied to the inertial object 21. Assuming that the distance between the inertial object 21 and the effective stiffness controlling electrode 24 is $h_0$ in an initialized state of no voltage application, the natural frequency $f_n$ of the vibratory structure is expressed as follows.

$$f_n = \frac{1}{2\pi} \sqrt{\frac{k}{m}}$$

Figure 2B:
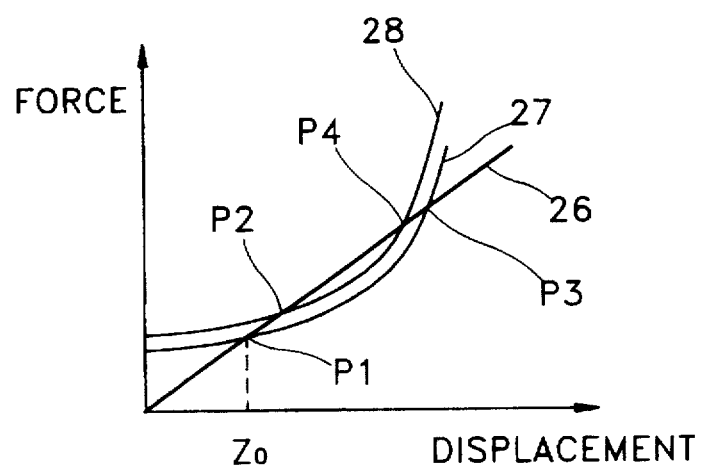
FIG. 2B is a graph of elastic force and electric force applied to the vibratory structure in FIG. 2A.

FIG. 2B illustrates the elastic force and the electric force applied to the inertial object 21 with respect to the displacement thereof. In FIG. 2B, reference numeral 26 denotes a curve for the elastic force, reference numeral 27 denotes a curve for an electric force at a relatively low voltage, and reference numeral 28 denotes a curve for an electric force at a relatively high voltage. The curve 26 for the elastic force intersects with the curves 27 and 28 for the electric forces at two points P1 and P2. The inertial object 21 is in stable equilibrium at the two points P1 and P2, while the inertial object 21 is in a relatively unstable equilibrium at the other two points P3 and P4.

Figure 2C:
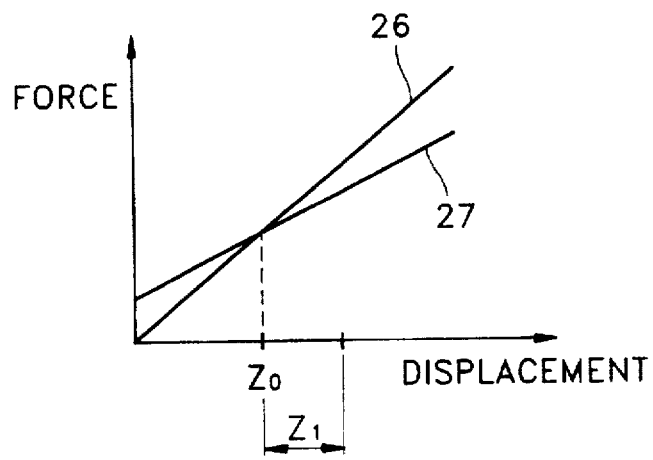
FIG. 2C is a magnified view of the graph of FIG. 2B.

FIG. 2C illustrates a magnified portion around the point P1 of FIG. 2B. In FIG. 2C, the displacement of the inertial object 21 at the point P1 is $z_0$, which is calculated by $$F = kz_0 = \frac{1}{2} \left( \frac{\partial C}{\partial z} \right) V^2$$

since the electric force is equal to the elastic force at the point P1. Thus, $$z_0 = \frac{1}{2k} \left( \frac{\partial C}{\partial z} \right) V^2$$

In the above equations, $$\frac{\partial C}{\partial z} = \frac{\epsilon A}{(h_0 - z_0)^2},$$

in which C indicates capacitance, A indicates the area of an electrode, $\epsilon$ indicates the dielectric constant between the electrode plates.

When the inertial object 21 shifts from the balance position $z_0$ by a small distance $z_1$, a restoring force $F_r$ is given by $$F_r: k(z_0 + z_1) - \frac{1}{2} \left[ \frac{\epsilon A}{(h_0 - (z_0 + z_1))} \right] V^2$$

Given the distance between the inertial object 21 in the balance state and the effective stiffness controlling electrode as $h_1$, $h_1 = h_0 - z_0$, which is expressed as a linear equation $$F_r = k(z_0 + z_1) - \frac{1}{2} \frac{\epsilon A}{h_1^2} V^2 \left( 1 + 2\frac{z_1}{h_1} \right)$$

under the assumption that $z_1/h_1 \ll 1$.

However, because $$kz_0 = \frac{1}{2} \left( \frac{\partial C}{\partial z} \right) V^2,$$

the restoring force $F_r$ is reduced to $$F_r = z_1 \left[ k - V^2 \left( \frac{\epsilon A}{h_1^3} \right) \right]$$

According to the above equation, when the inertial object 21 moves from the balance point P1 by the displacement $z_1$, which is infinitesimal, with the voltage V applied, the restoring force can be determined by the spring constant k, the dielectric constant $\epsilon$, the electrode area A, and the distance $h_1$ between the inertial object 21 and the effective stiffness controlling electrode 24. Therefore, from the above equation, the effective stiffness can be defined as $$k_{\mathit{eff}} = k - V^2 \left( \frac{\epsilon A}{h_1^3} \right)$$

Referring to FIG. 2C, the effective stiffness is the value obtained by subtracting the inclination of the curve 27 for the electric force from the inclination of the curve 26 for the elastic force (i.e., the spring constant). Hence, the effective stiffness can be defined as the difference between the inclinations of the elastic force curve and the electric force curve at the balance point.

Referring to FIG. 2B, when the voltage V is increased, the electric force shifts from the curve 27 to the curve 28. Accordingly, it is observed that the difference between the inclinations of the elastic force and the electric force, that is, the effective stiffness is reduced. As a result, the vibration system of FIG. 2A can be considered as an equivalent vibration system having the mass m and the spring constant $k_{\mathit{eff}}$ and the natural frequency of the vibratory structure is calculated by $$f_{n(v)} = \frac{1}{2\pi} \sqrt{\frac{k_{\mathit{eff}}}{m}}$$
$$= \frac{1}{2\pi} \sqrt{\frac{1}{m} \left( k - \frac{\epsilon A}{h_1^3} V^2 \right)}$$

Figure 1A:
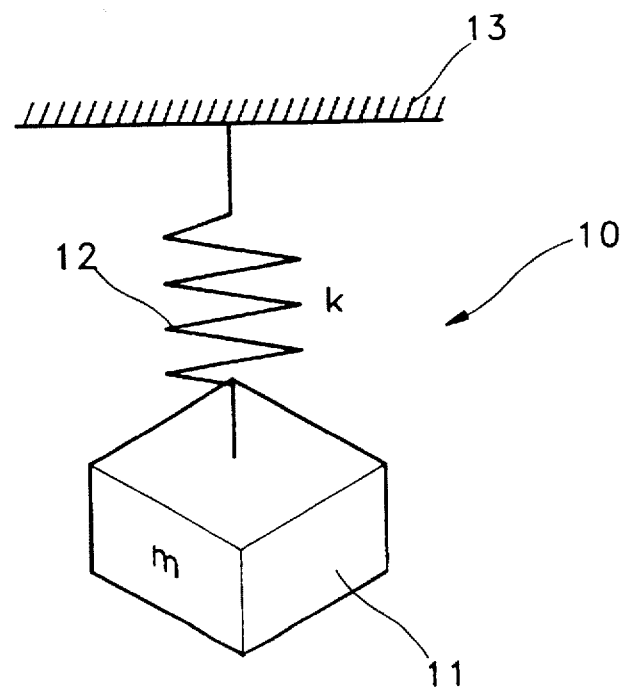
FIG. 1A is a schematic view of a conventional vibratory structure.
Figure 1B:
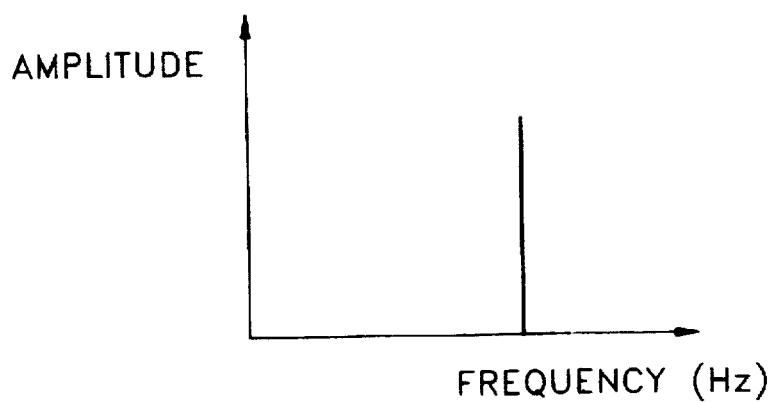
FIG. 1B is a graph of the vibration in the vibratory structure of FIG. 1A.

As is noted from the above equation, the natural frequency of the vibration system of FIG. 2A varies with an increase in the voltage V. When a voltage is not applied, the natural frequency is equal to that of the vibration system of FIG. 1A, and when the voltage is applied, the natural frequency is decreased. In a case of a sensor employing a polysilicon vibration system, the effective stiffness of a spring can be controlled at about 1V. Therefore, the natural frequency of the vibratory structure can be controlled by controlling a voltage applied to the effective stiffness controlling electrode.

Figure 2D:
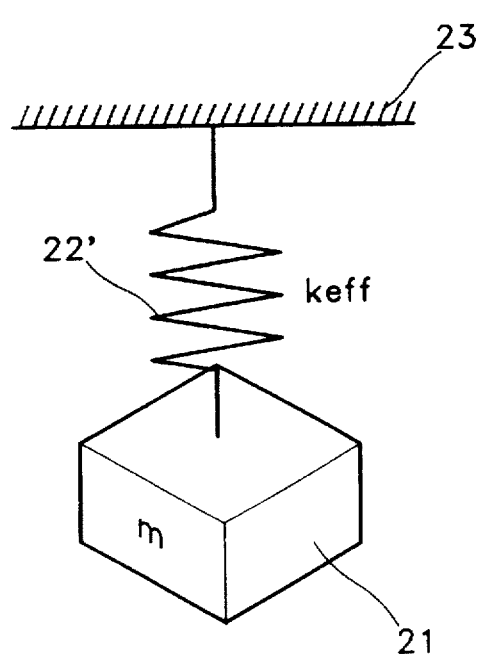
FIG. 2D is a schematic view of an equivalent vibratory structure to that of FIG. 2A.
Figure 2E:
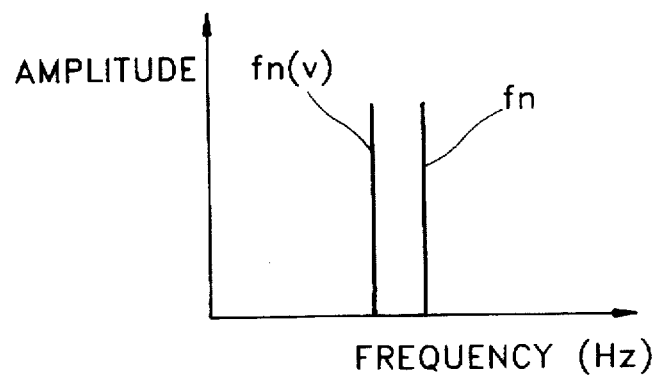
FIG. 2E is a graph of a vibration in the vibratory structure of FIG. 2A.

FIG. 2D illustrates an equivalent vibratory structure to that of FIG. 2A, in which the stiffness or constant k of a spring 22' is replaced with the effective stiffness $k_{\mathit{eff}}$. FIG. 2E shows that the frequency $f_n$ before voltage application is reduced to $f_{n(v)}$ with voltage application.

Figure 3:
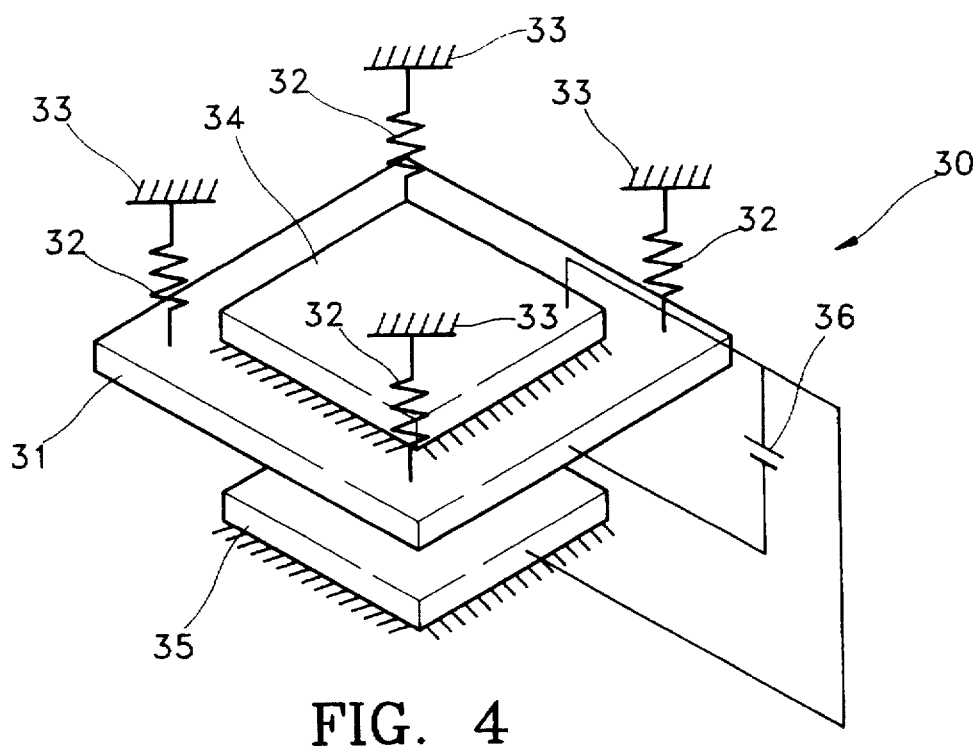
FIGS. 3–5 are schematic views of vibratory structures according to second, third and fourth embodiments of the present invention, respectively.

FIG. 3 illustrates a vibratory structure 30 employing an effective stiffness controlling electrode according to a second embodiment of the present invention. In this vibratory structure, a plurality of springs 32 are supported by a plurality of support ends 33, and an inertial object or a middle electrode 31 is supported by the springs 32. The middle electrode 31 is disposed between an upper electrode 34 and a lower electrode 35. Here, the upper and lower electrodes 34 and 35 serve as effective stiffness controlling electrodes. A power supplier 36 supplies voltage between the electrodes 31 and 34 & 35.

An electric force applied to the middle electrode 31 in the above vibratory structure is equal upward and downward, and thus balanced in the middle portion. The effective stiffness in the balanced position is expressed as $$k_{\mathit{eff}} = k - V^2 \left( \frac{\epsilon A}{h_1^3} \right),$$

in which k indicates the spring constant of the springs 32. A indicates the area of the upper and lower electrodes 34 and 35, and $h_1$ denotes the distance between the middle electrode 31 and each of the upper and lower electrodes 34 and 35. The natural frequency of the vibration system shown in FIG. 3 can be controlled by controlling the effective stiffness.

Figure 4:
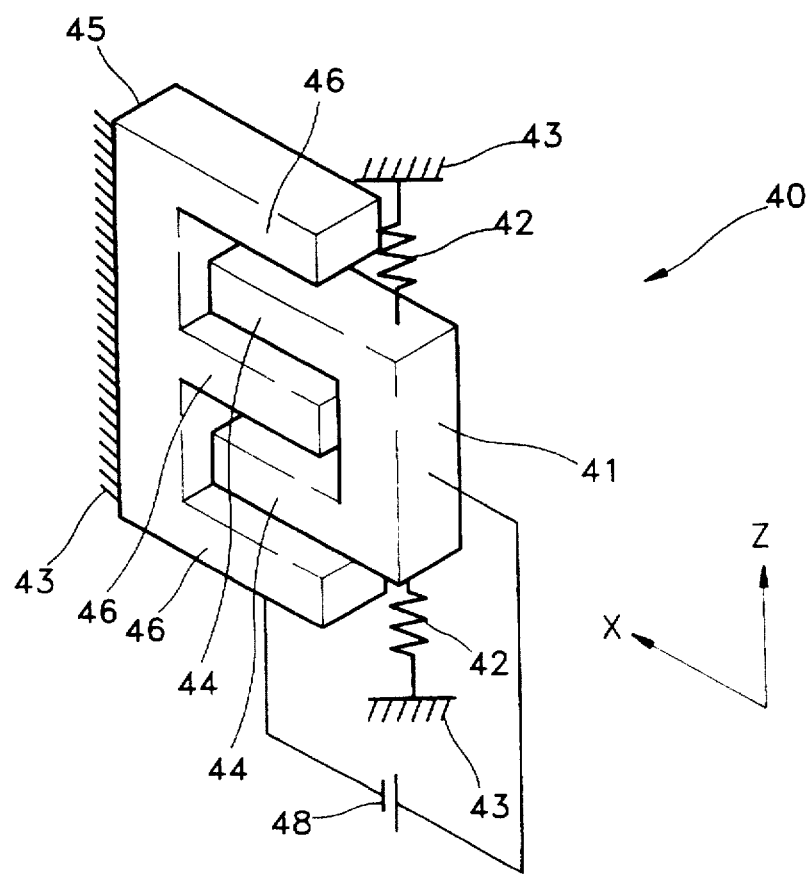

FIG. 4 illustrates a vibratory structure 40 employing an effective stiffness controlling electrode according to a third embodiment of the present invention. The vibratory structure includes a plurality of springs 42 supported by a plurality of support ends 43, and an inertial object 41 includes finger-like electrodes 44. An effective stiffness controlling electrode 45 is also formed into fingers and fixed to the support ends 43. The fingers 46 of the effective stiffness controlling electrode 45 are engaged with the fingers 44 of the inertial object 41, spaced from each other by a predetermined distance. A power supplier 48 supplies voltage across the electrodes 44 and 46. The natural frequency with respect to a Z-axis directional displacement can also be controlled by controlling an applied voltage in the vibratory structure as constituted above.

Figure 5:
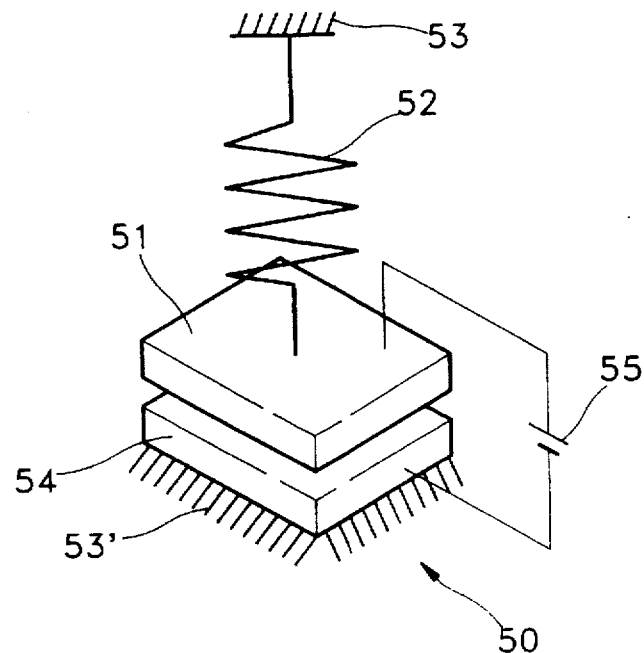

FIG. 5 illustrates a vibratory structure 50 employing a rotating inertial object according to a fourth embodiment of the present invention. An inertial object 51, which is supported by a first support end 53 via a spring 52, rotates, and the spring 52 has a rotational stiffness. An effective stiffness controlling electrode 54 fixed to a second support end 53' is disposed under the inertial object 51 by a predetermined separating distance. A voltage is applied between the inertial object 51 and the effective stiffness controlling electrode 54 by a power supplier 55. In this case, a rotational effective stiffness produced by an applied voltage has a constant value with respect to an infinitesimal rotation of the inertial object 51. Thus, the natural frequency with respect to the rotation can be controlled by the applied voltage.

Figure 6:
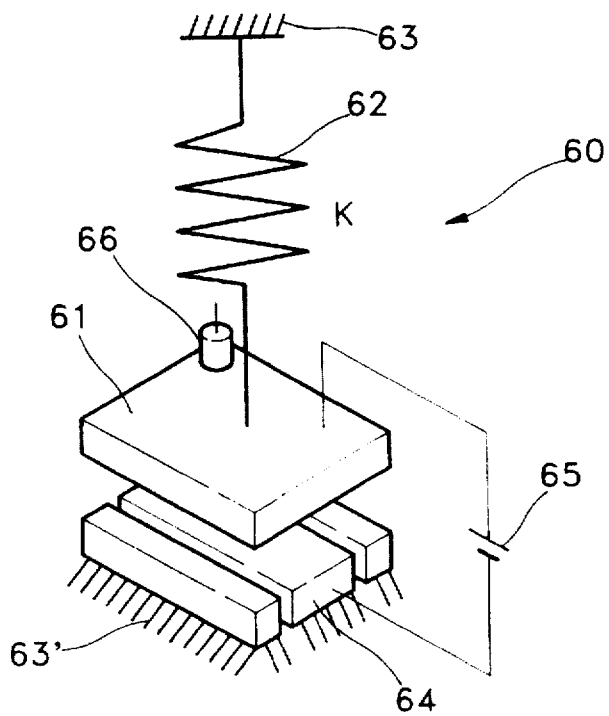
FIG. 6 is a schematic view of a first embodiment of an accelerator according to the present invention.

FIG. 6 illustrates an accelerator 60 employing an effective stiffness controlling electrode as described above, according to an embodiment of the present invention. The accelerator is provided with an inertial object 61 supported by a support end 63 via a spring 62, and a detector 66 for detecting the vibration of the inertial object 61 when an acceleration is input. The detector 66 may be a capacitance type for measuring the variation of capacitance, or a laser-using type. To control the natural frequency of the accelerator 60, there are provided the effective stiffness controlling electrode 64 supported by a support end 63' and facing the inertial object 61 and a power supplier 65 for supplying voltage.

As described above, in the accelerator 60 as constituted above, when a voltage is applied to the effective stiffness controlling electrode 64, its effective stiffness is constant in a balance position. Thus, the natural frequency can be controlled by the applied voltage. With the mass m of the inertial object and the effective stiffness $k_{\mathit{eff}}$, the displacement z of the inertial object 61 with respect to an input acceleration a can be represented as $z = ma/k_{\mathit{eff}}$, which indicates that a response to the displacement of the inertial object 61 can be controlled by varying the effective stiffness. That is, the magnitude of an acceleration output signal with respect to the acceleration input can be controlled, and the performance of the accelerator can be changed by controlling a voltage applied to the effective stiffness controlling electrode.

Figure 7A:
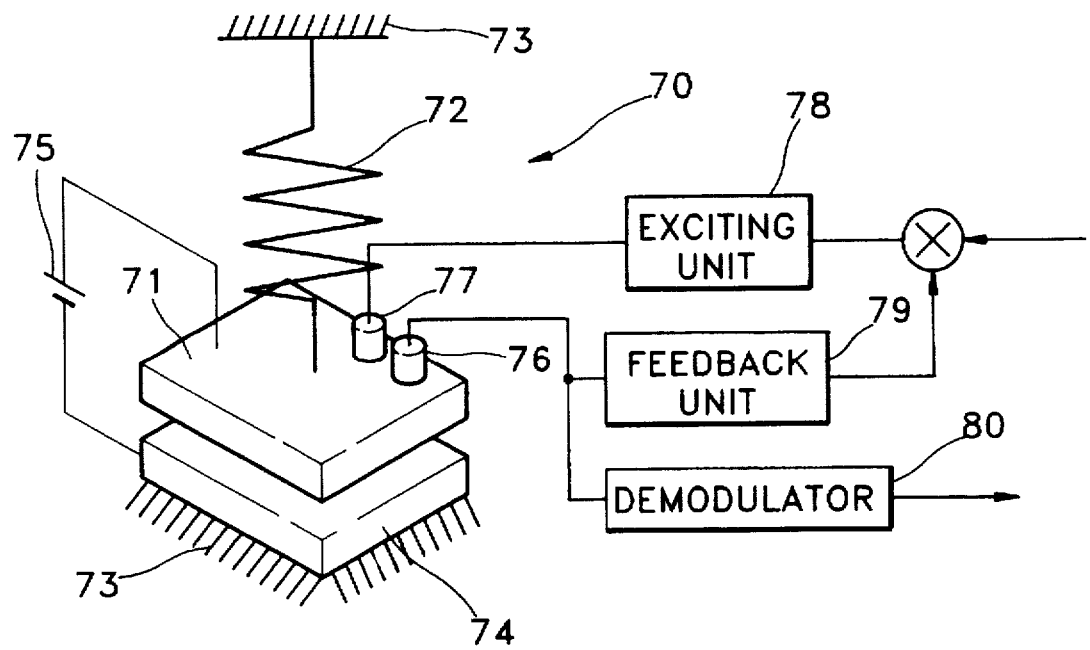
FIG. 7A is a schematic view of a second embodiment of an accelerator according to the present invention.

FIG. 7A illustrates a resonant accelerator 70 having an exciter, according to another embodiment of the present invention. The resonant accelerator 70 includes an inertial object 71 supported by a support end 73 via a spring 72, an exciter 77 for exciting the inertial object 71, and a detector 76 for detecting the vibration of the inertial object 71. A signal of the inertial object 71 detected in the detector 76 is fed back to an exciting unit 78 through a feedback unit 79 to resonates the inertial object 71. An effective stiffness controlling electrode 74 and a power supplier 75 are also provided.

Figure 7B:
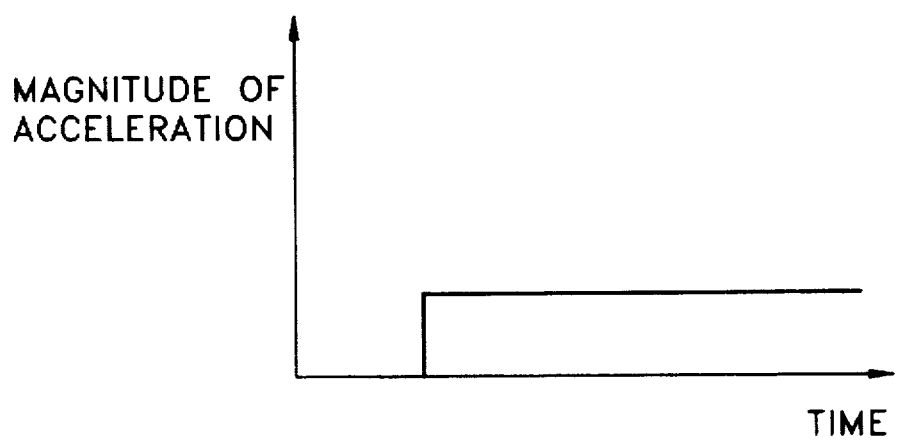
FIG. 7B is a graph of an acceleration input.
Figure 7C:
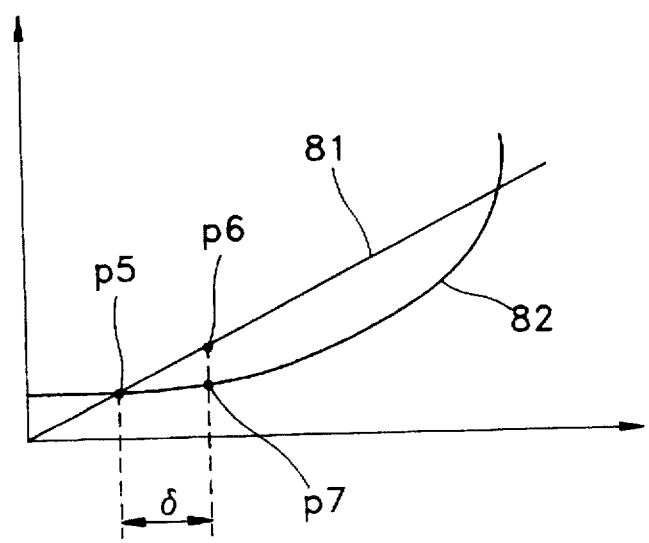
FIG. 7C is a graph of an elastic force and an electric force applied to the accelerator of FIG. 7A.

When the inertial object 71 is excited with application of a voltage to the inertial object 71 and the effective stiffness controlling electrode 74, an elastic force and an electric force to the inertial object are represented as curves 81 and 82, respectively, in FIG. 7C. In this case, when an acceleration is not input, a point P1 in which the curves 81 and 82 meet is a balance point, and the inertial object 71 resonates at the natural frequency of a vibration system according to an effective stiffness.

When an acceleration a shown in FIG. 7B is input to the above resonant accelerator, the balance points of the electrodes shift from the initial point P5 by σ, that is, to points P6 and P7. The displacement is $$\sigma = \frac{ma}{k_{\mathit{eff}}}.$$

As noted, the effective stiffness for the presence of an acceleration input is different from that for the absence of the acceleration input in the resonant accelerator. The effective stiffness for the presence of the input of the acceleration a is represented as the difference between the curves 81 and 82 for elastic force and electric force at the point separated by σ, which indicates that the effective stiffness for the acceleration input is smaller than that for the absence of an acceleration input. Therefore, the input of the acceleration decreases the natural frequency. That is, the natural frequency is decreased for a positive acceleration, while the natural frequency is increased for a negative acceleration. The increase and decrease of the natural frequency with respect to the acceleration input can be controlled by a voltage supplied from the power supplier 75.

Figure 7D:
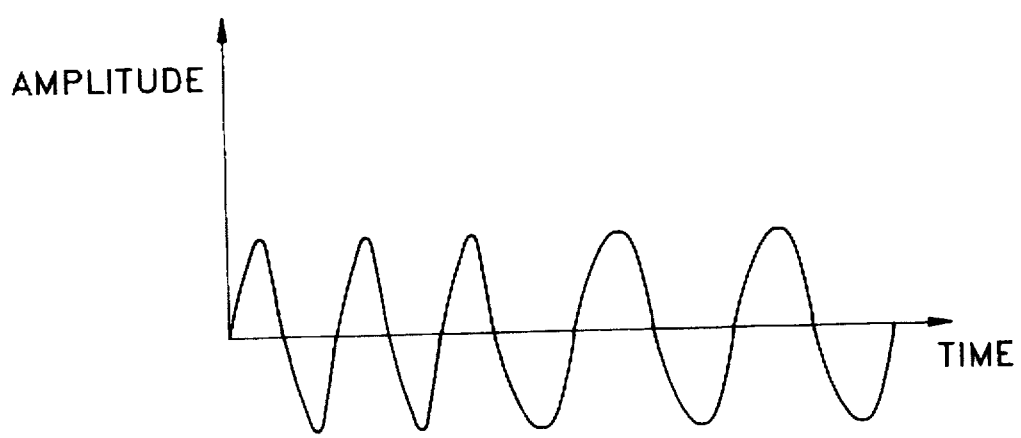
FIG. 7D is a graph of a vibratory signal depending on the acceleration input.

FIG. 7D is a graph of a vibratory signal output when the acceleration a is input, in which an input of the acceleration decreases the natural frequency. Since the frequency-modulated signal is obtained from the resonant accelerator, an acceleration signal can be obtained from a demodulator 80 of FIG. 7A.

FIG. 8 illustrates a vibratory structure 100 in a gyroscope employing an effective stiffness controlling electrode. The gyroscope relies on the principle that the rotational angular velocity is calculated by detecting a Coriolis force, which is generated in a third axis direction perpendicular to first- and second-axis directions when an input of a rotational angular velocity around the second axis direction perpendicular to the first axis direction is applied to an inertial object which vibrates or rotates at a predetermined velocity in the first axis direction. While the vibratory structure in the vibration system of FIGS. 1–7 are singe-axis or rotational, the gyroscope has a bi-axial vibratory structure on a silicon wafer substrate 101. The vibratory structure can be formed of any material so long as it is conductive. The vibratory structure is supported by a relatively thick support 102 on the silicon substrate 101. The other portions other than the support 102 are made thin and detached from the substrate 101 by a predetermined distance in a Z-axis direction. The vibratory structure is provided with springs 103 and 104 and an inertial object 105. Drivers 109 are provided at both sides of the vibratory structure to vibrate the structure in an X-axis direction. The drivers 109 are also formed of a conductive material, and serve as an electrode. An electrostatic force is generated at fingers 110 of the drivers 109, leading to the vibration of fingers 106 of the structure, when current flows through the drivers 109. A detecting electrode (not shown) may be provided under the vibratory structure to detect the Z-axis directional displacement of the vibratory structure. The Z-axis directional displacement of the vibratory structure can be measured from variations in capacitance generated in the detecting electrode. Fingers 106 and 107 are for driving the inertial object in the X-axis direction or detecting the X-axis directional displacement of the inertial object 105.

To calculate an angular velocity of a rotational inertial object rotating around a Y-axis direction in the gyroscope adopting the above vibratory structure, an X-axis directional frequency is measured from a center sensing electrode 108 disposed in the middle of the vibratory structure, while the vibratory structure vibrates in the X-axis direction by means of the electrostatic force of the fingers 110, the Z-axis directional frequency is measured by a surface sensing electrode (not shown) disposed under the vibratory structure, to thereby process the data.

As described above, the inertial object 105 is vibrated in the X- and Z-axis directions since the springs 103 and 104 are connected to the support 102 fixed on the substrate 101 in the gyroscope. The gyroscope has natural frequency $f_x$ and $f_z$ for both axes, as indicated by reference numerals 121 and 122, respectively, in FIG. 8C. Here, errors of the natural frequencies for both the axes in the vibratory structure should be limited within predetermined values, to ensure the performance of the gyroscope. However, a processing error of 0.1–1 μm is observed in etching or chemical vapor deposition for fabrication of the vibratory structure 100 by a conventional semiconductor manufacturing technology. This error in a manufacturing process causes the spring constant of the vibratory structure and the mass of the inertial object 105 to deviate from intended values to a great extent, leading to a failure in achieving the desired natural frequencies for both axes. It follows that the performance of the gyroscope lowers. In the prior art, a spring or an inertial object is etched or deposited, to overcome these problems.

Figure 8A:
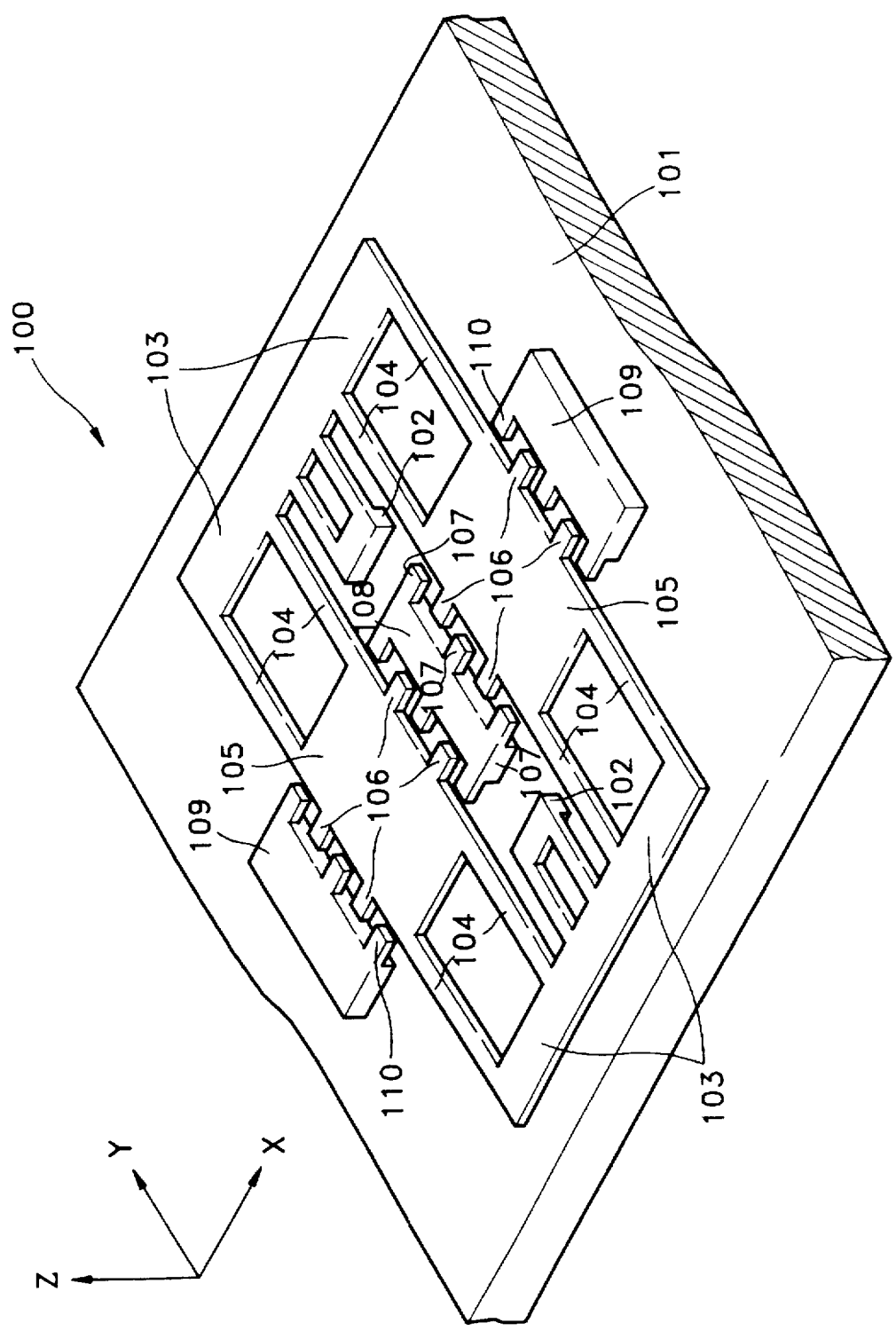
FIG. 8A is a schematic view of a vibratory structure in a gyroscope.

According to the present invention, the bi-axial natural frequencies of the gyroscope shown in FIG. 8A can be controlled by employing an effective stiffness controlling electrode. To control the Z-axis natural directional frequency $f_z$, the effective stiffness controlling electrode is disposed along the Z-axis direction, and a voltage is applied between the inertial object which vibrates and the effective stiffness controlling electrode. The natural frequency can be increased or decreased by adjusting the magnitude of the voltage. Thus, the voltage is changed until the Z-axis directional frequency comes within an allowable error range as designed for the gyroscope. To control the X-axis directional natural frequency $f_x$, the effective stiffness controlling electrode is disposed along the X-axis direction, and a voltage is applied between the inertial object which vibrates and the effective stiffness controlling electrode. The natural frequency can be increased or decreased by adjusting the magnitude of the voltage. Thus, the voltage is changed until the X-axis directional frequency comes within an allowable error range as designed for the gyroscope.

Figure 8B:
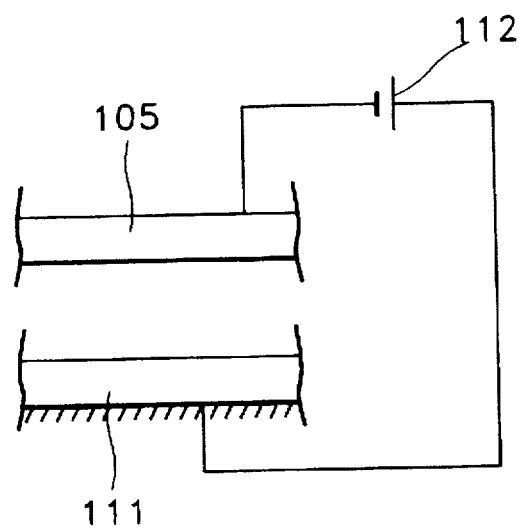
FIG. 8B is a schematic view of an effective stiffness controlling electrode in the gyroscope.
Figure 8C:
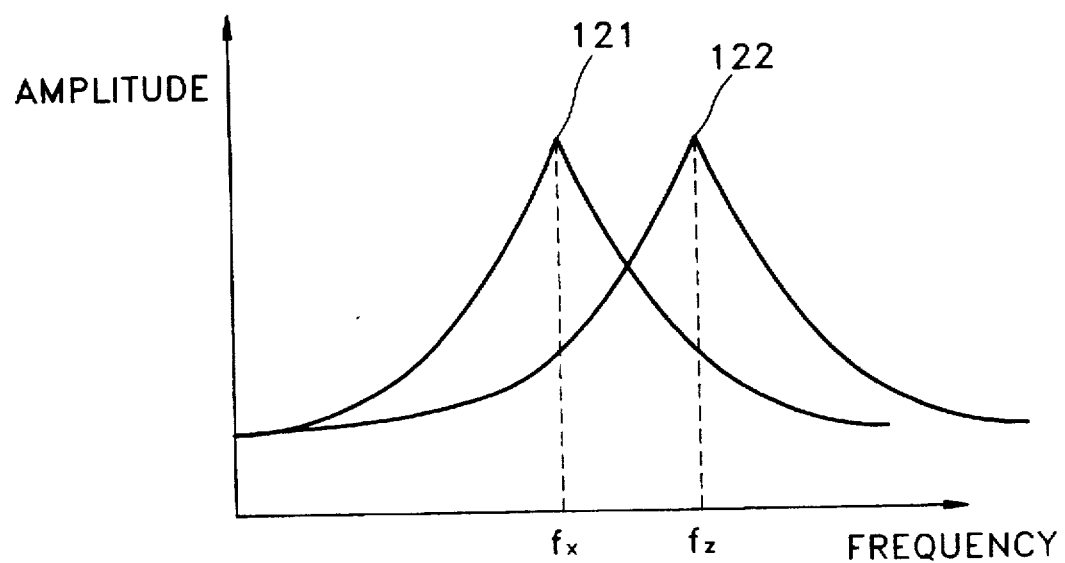
FIG. 8C is a graph of a vibration with respect to each axis in a bi-axial vibratory structure in the gyroscope.

FIG. 8B illustrates an exemplary application of the above effective stiffness controlling electrode. To control a Z-axis directional natural frequency, an effective stiffness controlling electrode 111 is provided between the inertial object 105 and the substrate 101 shown in FIG. 8A, and a voltage is applied to the inertial object 105 by a power supplier 112. The effective stiffness controlling electrode 111 may be installed independently or may be replaced with a detecting electrode for detecting a Z-axis directional vibration, as described above.

The vibratory structure adopting the effective stiffness controlling electrode according to the present invention can control its natural frequency sufficiently, even when its structure is simple. This advantage contributes to controlling and improving the performance of a sensor, an accelerator, an actuator, or a gyroscope which employs the vibratory structure. In particular in a bi-axial vibratory structure such as the gyroscope, the natural frequency for an axis, which has a significant impact on a manufactured product, can be easily controlled.

The foregoing description of the present invention has been limited to the above embodiments. It will be apparent, however, that variations and modifications may be made to the invention by anyone skilled in the art. Therefore, it is the object of the appended claims to cover all such variations and modification as come within the true spirit and scope of the invention.

What is claimed is:

1. A vibratory structure comprising:
   at least one elastic member supported by a first support end;
   an inertial object which vibrates by the elastic force of said elastic member;
   a moving electrode coupled to said inertial object;
   at least one effective stiffness controlling electrode supported by a second support end; and
   a power supplier for applying a voltage to generate an electric force between said moving electrode and said effective stiffness controlling electrode.

2. A vibratory structure as claimed in claim 1, wherein said inertial object and said moving electrode are integrally formed.

3. A vibratory structure as claimed in claim 1, wherein said inertial object vibrates in one axis direction, and said effective stiffness controlling electrode is disposed to face said inertial object along said axis direction.

4. A vibratory structure as claimed in claim 1, wherein said inertial object vibrates in one axis direction, and two effective stiffness controlling electrodes are disposed under and over said inertial object.

5. A vibratory structure as claimed in claim 1, wherein said moving electrode has at least one finger, and said effective stiffness controlling electrode has at least two fingers which can be positioned on opposing sides of said at least one finger fingers of said moving electrode with a predetermined distance.

6. A vibratory structure as claimed in claim 1, wherein said elastic member is a rotational spring having a rotational stiffness, and said inertial object rotates.

7. A vibratory structure as claimed in claim 1, wherein an electric force between said effective stiffness controlling electrode and said moving electrode is equal to the elastic force of said elastic member according to the change of the voltage supplied from said power supplier.

8. A method for controlling the natural frequency of a vibratory structure, said vibratory structure comprising: at least one elastic member supported by a first support end; an inertial object which vibrates by the elastic force of said elastic member; a moving electrode coupled to said inertial object; at least one effective stiffness controlling electrode supported by a second support end; and a power supplier for applying a voltage to generate an electric force between said moving electrode and said effective stiffness controlling electrode, wherein the effective stiffness and natural frequency of said vibratory structure are controlled by adjusting said voltage.

9. A method for controlling the natural frequency of a vibratory structure as claimed in claim 8, wherein said inertial object and said moving electrode are integrally formed.

10. An actuator including at least one vibratory structure, said vibratory structure comprising: at least one elastic member supported by a first support end; an inertial object which vibrates by the elastic force of said elastic member; a moving electrode coupled to said inertial object; at least one effective stiffness controlling electrode supported by a second support end; and a power supplier for applying a voltage to generate an electric force between said moving electrode and said effective stiffness controlling electrode, wherein the effective stiffness and natural frequency of said vibratory structure are controlled by adjusting said voltage.

11. An actuator as claimed in claim 10, wherein said inertial object and said moving electrode are integrally formed.

12. A gyroscope comprising:

a substrate having a plane of a first axis and a second axis;

a support end supported by said substrate;

an elastic member supported by said support and extended in said first- and second-axis directions;

an inertial object for vibrating in said first axis direction and a third axis direction;

a finger electrode formed integrally into said inertial object;

a driving unit having a finger to be engaged with said finger electrode of said inertial object, for applying an electric force to said inertial object in said first axis direction;

detector means for detecting vibration of said inertial object in said first- and third-axis directions;

an effective stiffness controlling electrode disposed to face said inertial object on said substrate to control the third-axis directional natural frequency of said inertial object; and a power supplier for applying a voltage to said effective stiffness controlling electrode and said finger electrode of said inertial object.

13. A gyroscope as claimed in claim 12, wherein said detector means for detecting vibrations measures directional natural frequency of said inertial object.

14. A method for controlling the natural frequency of a gyroscope comprising:

providing a substrate having a plane of a first axis and a second axis;

providing a support end supported by said substrate;

providing an elastic member supported by said support and extended in said first and second axis directions;

providing an inertial object for vibrating in said first axis direction and a third direction;

providing a finger electrode formed integrally into said inertial object;

engaging a driving unit having a finger with said finger electrode of said inertial object for applying an electric force to said inertial object in said first axis direction;

detecting vibrations of said inertial object in said first and third axis directions;

controlling the third axis directional natural frequency of said inertial object using an effective stiffness controlling electrode disposed to face said inertial object on said substrate; and applying a voltage to said effective stiffness controlling electrode and said finger electrode of said inertial object.

* * * * *